United States Patent
Sato et al.

(10) Patent No.: US 8,193,101 B2
(45) Date of Patent: Jun. 5, 2012

(54) SUBSTRATE PROCESSING APPARATUS AND SEMICONDUCTOR DEVICE MANUFACTURING METHOD FOR FORMING FILM

(75) Inventors: Taketoshi Sato, Toyama (JP); Kazuyuki Toyoda, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 534 days.

(21) Appl. No.: 12/502,387

(22) Filed: Jul. 14, 2009

(65) Prior Publication Data

US 2010/0015811 A1      Jan. 21, 2010

(30) Foreign Application Priority Data

Jul. 16, 2008   (JP) .................................. 2008-184529

(51) Int. Cl.
*H01L 21/31* (2006.01)
*C23C 16/00* (2006.01)

(52) U.S. Cl. ...... 438/765; 438/769; 438/771; 118/723 E

(58) Field of Classification Search .......... 438/765–784; 118/696–706, 723 E, 723 R, 723 ER, 723 I, 118/723 IR See application file for complete search history.

(56) References Cited

U.S. PATENT DOCUMENTS

| | | | |
|---|---|---|---|
| 6,660,660 B2 * | 12/2003 | Haukka et al. | 438/778 |
| 2004/0053471 A1 * | 3/2004 | Kikuchi et al. | 438/286 |
| 2004/0053472 A1 * | 3/2004 | Kiryu et al. | 438/287 |
| 2010/0233887 A1 * | 9/2010 | Miya et al. | 438/786 |

* cited by examiner

*Primary Examiner* — Kevin M Picardat
(74) *Attorney, Agent, or Firm* — Brundidge & Stanger, P.C.

(57) ABSTRACT

Provided is a substrate processing apparatus. The substrate processing apparatus includes a process chamber, a gas supply system, a gas discharge system, an RF (radio frequency) unit, an electrode, and a control device. The control device controls the gas supply system, the gas discharge system, and the RF unit. While the control device controls the RF unit to apply predetermined RF power to the electrode for generating plasma, the control device controls the gas supply system to supply a process gas to the process chamber alternately at a first flowrate and at a second flowrate greater than the first flowrate.

5 Claims, 10 Drawing Sheets

PLASMA GENERATION REGION vs PRESSURE·ELECTRODE DISTANCE·FREQUENCY

DISCHARGE START VOLTAGE Vst AND CONVERTED ELECTRODE DISTANCE pd OF GASES

SUBSTRATE PROCESSING APPARATUS AND SEMICONDUCTOR DEVICE MANUFACTURING METHOD FOR FORMING FILM

CROSS-REFERENCE TO RELATED PATENT APPLICATION

This U.S. non-provisional patent application claims priority under 35 U.S.C. §119 of Japanese Patent Application No. 2008-184529, filed on Jul. 16, 2008, in the Japanese Patent Office, the entire contents of which are hereby incorporated by reference.

BACKGROUND OF THE INVENTION

1. Field of the Invention

The present invention relates to a substrate processing apparatus configured to process a substrate using plasma and a semiconductor device manufacturing method for forming a film.

2. Description of the Prior Art

Generally, a film is formed on a surface of a wafer by supplying a raw material to the surface of the wafer and heating the surface of the wafer. However, since recent miniature silicon devices are required to be manufactured at a low temperature, plasma is currently used as replacement of thermal energy.

Up to now, in a substrate processing apparatus using plasma, a plasma generating unit is installed at a place spaced apart from a wafer, and an active species (radical) generated by the plasma generating unit is transferred to a wafer accommodating unit, so as to protect a wafer from plasma damages.

However, in the case where the plasma generating unit is installed apart from a wafer, a long transfer passage is necessary to transfer an active species from the plasma generating unit to the wafer accommodating unit, so that the active species is easily deactivated on the way to the plasma generating unit and it is difficult to improve the film quality and reduce the film forming time.

Thus, in another method of the related art, a plasma generating unit is installed at a place close to a wafer, and an active species is supplied to the wafer from a place close to the wafer, in order to improve the film quality and film forming time (for example, refer to Patent Document 1).

FIG. 13A and FIG. 13B illustrate an exemplary structure of a process furnace of a substrate processing apparatus of the related art. FIG. 13A is a side sectional view, and FIG. 13B is a cross-sectional view.

A process furnace 1 includes a reaction tube 4 in which a plurality of wafers 2 are stacked; a gas supply system 5 configured to supply a predetermined reaction gas to the reaction tube 4; a gas discharge system 7 configured to discharge the inside atmosphere of a process chamber 6; a radio frequency (RF) unit 8 configured to output predetermined RF power; first and second electrodes 9 and 10 to which RF power is applied from the RF unit 8 for exciting process gas into plasma; and a control device 12 configured to control the gas supply system 5, the gas discharge system 7, and the RF unit 8. In a substrate processing operation, a boat 3 in which a plurality of wafers 2 are stacked is inserted into the reaction tube 4.

The gas supply system 5 includes a nozzle 5a extending along the stacked direction of the wafers 2, and the nozzle 5a includes a plurality of gas supply holes 5b. In addition, the first and second electrodes 9 and 10 are installed in a manner such that a process gas supplied through the first gas supply holes 5b can flow between the first and second electrodes 9 and 10. The control device 12 controls the RF unit 8 to apply predetermined RF power to the first and second electrodes 9 and 10 for generating plasma.

The control device 12 maintains the pressure inside the reaction tube 4 at a constant level by controlling the gas discharge system 7. The control device 12 controls the RF unit 8 to apply a voltage across the first and second electrodes 9 and 10. The control device 12 controls the gas supply system 5 to supply a desired process gas to a gap between the first and second electrodes 9 and 10 from the first gas supply holes 5b of the nozzle 5a, in order to generate plasma between the first and second electrodes 9 and 10. The process gas is excited by this plasma, and thus an active species is generated. The active species is supplied to the wafers 2 from sides of the wafers 2 to process the wafers 2. In this way, high-quality films can be formed on the wafers 2, and film forming time can be reduced.

[Patent Document 1] Japanese Unexamined Patent Application Publication No. 2005-56891

However, in the related art, when a process gas is supplied from a gas supply system, since upper and lower stacked substrates are at the same electric potential and the pressure inside a process chamber is uniform, it is difficult for an active species to enter between the substrates, and thus the center parts of the substrates are less processed than the other parts of the substrates.

In a method proposed to solve theses problems, a predetermined amount of process gas is supplied at a high flowrate. Although this method is used, the amount of an active species supplied between substrates is still insufficient.

SUMMARY OF THE INVENTION

An object of the present invention is to provide a substrate processing apparatus configured to sufficiently supply an active species between substrates for uniformly processing the substrates, and a semiconductor device manufacturing method for forming a film.

According to an aspect of the present invention, there is provided a substrate processing apparatus including: a process chamber configured to accommodate a plurality of stacked substrates; a gas supply system configured to supply a desired process gas to the process chamber; a gas discharge system configured to exhaust an inside atmosphere of the process chamber; an RF (radio frequency) unit configured to output predetermined RF power; an electrode configured to receive the predetermined RF power from the RF unit for exciting the process gas into a plasma state; and a control device configured to control the gas supply system, the gas discharge system, and the RF unit, wherein while the control device controls the RF unit to apply predetermined RF power to the electrode for generating plasma, the control device controls the gas supply system to supply the process gas to the process chamber alternately at a first flowrate and at a second flowrate greater than the first flowrate.

DETAILED DESCRIPTION OF THE PREFERRED EMBODIMENTS

Figure 3:
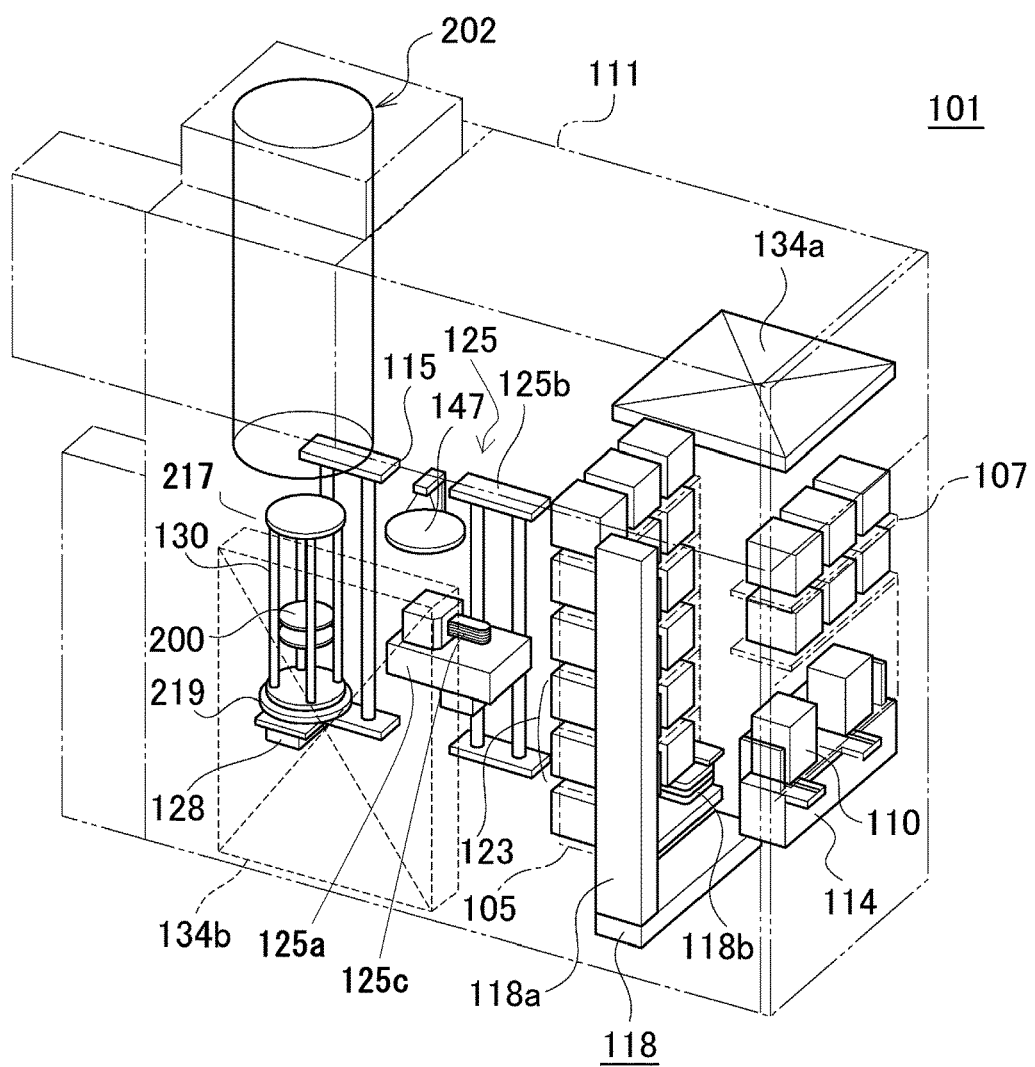
FIG. 3 is a perspective view illustrating a substrate processing apparatus according to an embodiment of the present invention.

According to preferred embodiments of the present invention, a substrate processing apparatus is configured as an example of a semiconductor manufacturing apparatus used to perform a processing process in a method of manufacturing a semiconductor device such as an integrated circuit (IC) device. In the following description, as a substrate processing apparatus, a vertical apparatus configured to perform a process such as oxidation, diffusion or chemical vapor deposition (CVD), or atomic layer deposition (ALD) on a substrate will be explained (hereinafter, the vertical apparatus will be simply referred to as a processing apparatus). FIG. 3 is a perspective view illustrating a processing apparatus according to the present invention.

As shown in FIG. 3, in a processing apparatus 101 of the current embodiment, cassettes 110 are used as wafer carriers for accommodating wafers (substrates) 200 made of a material such as silicon, and the processing apparatus 101 includes a housing 111. A front maintenance port (not shown) is formed in the lower side of a front wall of the housing 111 as an opening for maintenance works, and a front maintenance door (not shown) is installed to open and close the front maintenance port. A cassette carrying port (substrate container carrying port) is formed in the front maintenance door for connecting the inside and outside of the housing 111, and a front shutter (substrate container carrying port opening/closing mechanism) is used to open and close the cassette carrying port. At the inside of the cassette carrying port of the housing 111, a cassette stage (substrate container stage) 114 is installed. Cassettes 110 are carried onto the cassette stage 114, and carried away from the cassette stage 114, by an in-process carrying device (not shown).

On the cassette stage 114, the cassette 110 is placed by the in-process carrying device in a manner such that wafers 200 are vertically positioned inside the cassette 110 and a wafer carrying hole of the cassette 110 faces upward. The cassette stage 114 is configured so that the cassette 110 is rotated 90° counterclockwise in a longitudinal direction to the backward of the housing 111, and the wafers 200 inside the cassette 110 take a horizontal position, and the wafer carrying hole of the cassette 110 faces the backward of the housing 111.

Near the center part of the housing 111 in a front-to-back direction, a cassette shelf (substrate container shelf) 105 is installed. The cassette shelf 105 is configured so that a plurality of the cassettes 110 are stored in a plurality of stages and a plurality of rows. At the cassette shelf 105, a transfer shelf 123 is installed to store the cassettes 110, which are carrying objects of a wafer transfer mechanism 125.

In addition, at the upside of the cassette stage 114, a standby cassette shelf 107 is installed to store standby cassettes 110.

Between the cassette stage 114 and the cassette shelf 105, a cassette carrying device (substrate container carrying device) 118 is installed. The cassette carrying device 118 is configured by a cassette elevator (substrate container elevating mechanism) 118a, which is capable of moving upward and downward while holding the cassette 110, and a cassette carrying mechanism (substrate container carrying mechanism) 118b. The cassette carrying device 118 is designed to carry the cassette 110 among the cassette stage 114, the cassette shelf 105, and the standby cassette shelf 107, by continuous motions of the cassette elevator 118a and the cassette carrying mechanism 118b.

At the backside of the cassette shelf 105, the wafer transfer mechanism (substrate transfer mechanism) 125 is installed. The wafer transfer mechanism 125 is configured by a wafer transfer device (substrate transfer device) 125a that is capable of rotating or linearly moving the wafer 200 in a horizontal direction, and a wafer transfer device elevator (substrate transfer device elevating mechanism) 125b for moving the wafer transfer device 125a upward and downward. The wafer transfer device elevator 125b is installed at a right end part of the housing 111 (pressure-resistant housing). By continuous motions of the wafer transfer device elevator 125b and the wafer transfer device 125a, the wafer 200 is picked by tweezers (substrate holder) 125c of the wafer transfer device 125a and is charged into a boat (substrate holding unit) 217 and discharged from the boat 217.

At the upside of the rear part of the housing 111, a process furnace 202 is installed. The lower end part of the process furnace 202 is configured so as to be opened and closed by a furnace port shutter (furnace port opening/closing mechanism) 147.

At the downside of the process furnace 202, a boat elevator (substrate holding unit elevating mechanism) 115 is installed to move the boat 217 upward to and downward from the process furnace 202. An arm 128 is connected to an elevating table of the boat elevator 115 as a connecting unit, and a seal cap (cover part) 219 is horizontally installed on the arm 128. The seal cap 219 supports the boat 217 vertically and is configured to block the lower end part of the process furnace 202.

The boat 217 includes a plurality of holding members and is configured to hold a plurality of wafers 200 (for example, about fifty to one hundred fifty wafers) horizontally in a state where the centers of the wafers 200 are aligned and arranged in a vertical direction.

As shown in FIG. 3, at the upside of the cassette shelf 105, a cleaning unit 134a configured by a supply fan and a dust filter is installed to supply clean air as purified atmosphere, so that clean air can flow inside of the housing 111.

In addition, as schematically shown in FIG. 3, at the left side end part of the housing 111 opposite to the wafer transfer device elevator 125b and the boat elevator 115, another cleaning unit 134b configured by a supply fan and a dust filter is installed to supply clean air. Therefore, clean air can be blown from the cleaning unit 134b to the wafer transfer device 125a and the boat 217, and after passing through the wafer transfer device 125a and the boat 217, the air can be sucked by an exhaust device (not shown) and discharged to the outside of the housing 111.

Next, an operation of the processing apparatus will be described.

As shown in FIG. 3, before a cassette 110 is carried onto the cassette stage 114, the front shutter is moved to open the cassette carrying port. Thereafter, a cassette 110 is placed on the cassette stage 114 through the cassette carrying port in a state where wafers 200 are vertically positioned in the cassette 110 and the wafer carrying hole of the cassette 110 faces upward. Next, the cassette 110 is rotated counterclockwise by 90° in a longitudinal direction toward the backward of the housing 111 by the cassette stage 114 so that the wafers 200 inside the cassette 110 are horizontally positioned, and the wafer carrying opening of the cassette 110 faces the backward of the housing 111.

Then, the cassette 110 is automatically carried and placed by the cassette carrying device 118 to a specified shelf position of the cassette shelf 105 or the standby cassette shelf 107 so as to be temporarily stored, and then transferred to the transfer shelf 123 from the cassette shelf 105 or the standby cassette shelf 107, by the cassette carrying device 118, or directly transferred to the transfer shelf 123.

After the cassette 110 is transferred to the transfer shelf 123, the wafer 200 is picked up from the cassette 110 through the wafer carrying hole and is charged into the boat 217 disposed at the backward of a transfer chamber by the tweezers 125c of the wafer transfer device 125a. After delivering the wafer 200 to the boat 217, the wafer transfer device 125a returns to the cassette 110, and charges the next wafer 200 into the boat 217.

After a predetermined number of wafers 200 are charged into the boat 217, the lower end part of the process furnace 202 closed by the furnace port shutter 147 is opened by moving the furnace port shutter 147. Subsequently, the boat 217 holding the wafers 200 is loaded into the process furnace 202 by lifting the seal cap 219 using the boat elevator 115.

After the loading, a predetermined heat treatment is performed on the wafers 200 inside the process furnace 202. Thereafter, the wafers 200 and the cassette 110 are carried out to the outside of the housing 111 in a reverse sequence of the above.

Next, the process furnace will be described in detail.

Figure 1:
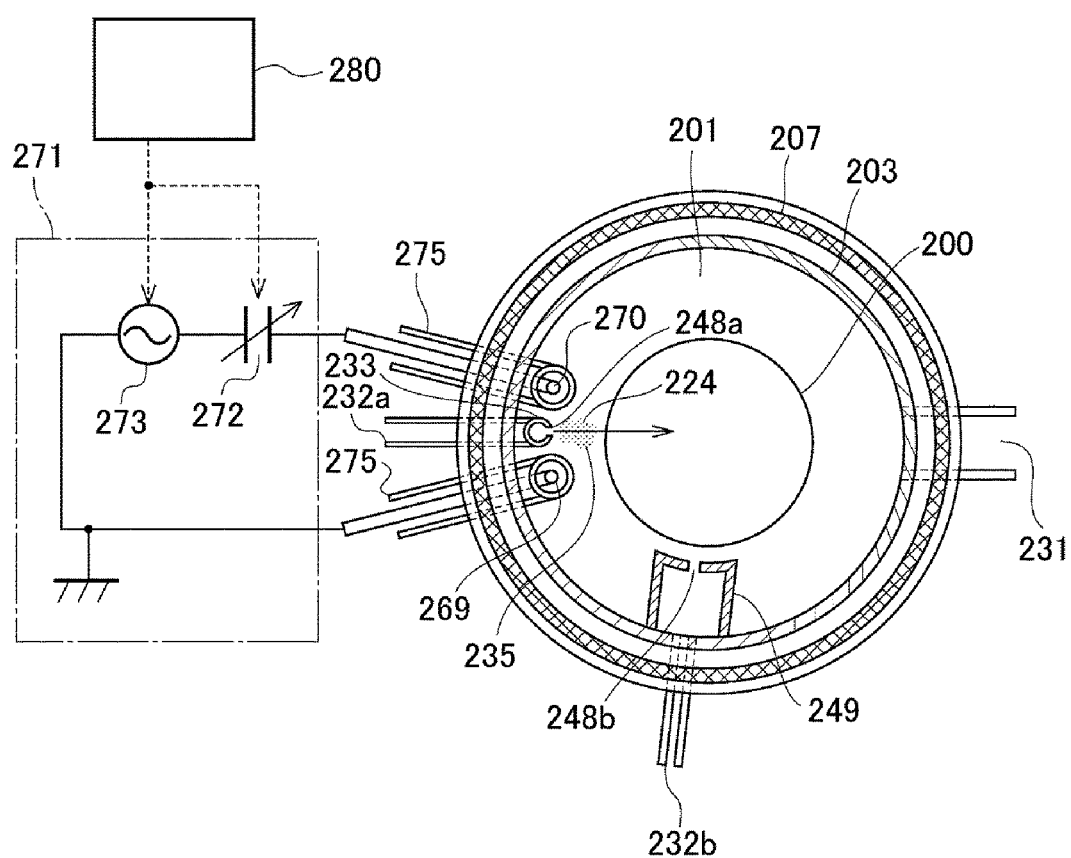
FIG. 1 is a schematic cross-sectional view illustrating a vertical substrate process furnace according to an embodiment of the present invention.
Figure 2:
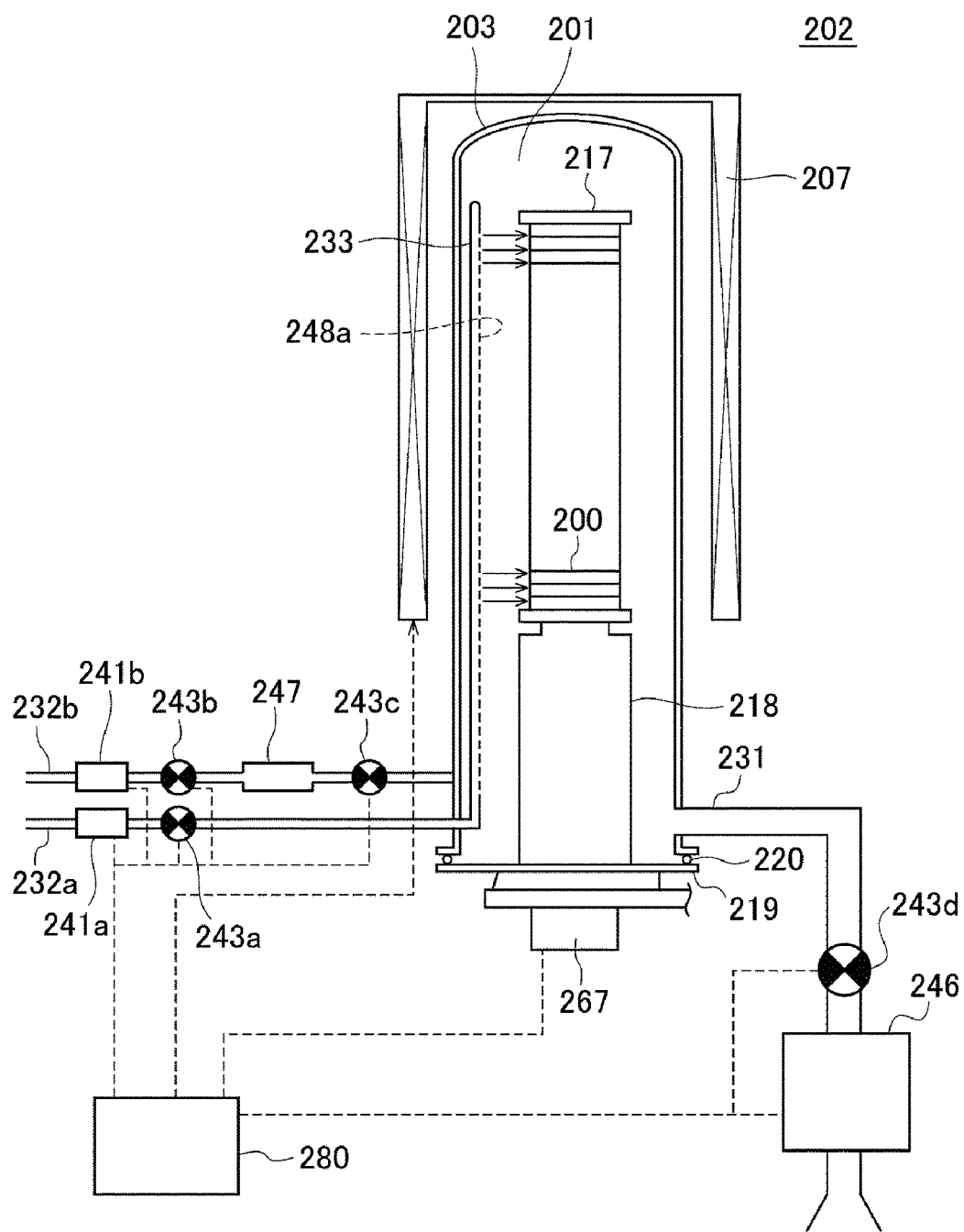
FIG. 2 is a schematic longitudinal sectional view illustrating a vertical substrate process furnace according to an embodiment of the present invention.

FIG. 1 is a cross-sectional view of a process furnace 202 for schematically illustrating a vertical substrate processing apparatus according to an embodiment of the present invention, and FIG. 2 is a longitudinal sectional view of the process furnace 202 for illustrating the vertical substrate processing apparatus according to the embodiment of the present invention.

The substrate processing apparatus of the current embodiment includes a controller 280 as a control unit, and operations of each part of the substrate processing apparatus and the process furnace 202 are controlled by the controller 280.

Inside a heater 207 which is a heating device (heating unit), a reaction tube (reaction vessel) 203 is installed to process wafers (substrates) 200, and a lower end opening of the reaction tube 203 is air-tightly closed by a seal cap (cover part) 219 in a state where an O-ring (airtight sealing member) 220 is disposed between the reaction tube 203 and the seal cap 219. A process chamber 201 is formed by at least the reaction tube 203 and the seal cap 219. At the seal cap 219, a boat 217 that is a substrate holding member (substrate holding unit) is installed in a state where a boat support stand 218 constituted by a quartz cap is disposed between the boat 217 and the seal cap 219. The boat support stand 218 is a holding body which is used to hold the boat 217. The boat 217 is inserted in the process chamber 201. At the boat 217, a plurality of wafers 200 to be batch processed are held in a horizontal position and are piled in multiple stages in an axial direction. In this way, the wafers 200 are stacked and accommodated in the process chamber 201. The heater 207 heats the wafers 200 placed inside the process chamber 201 to a predetermined temperature.

At the process chamber 201, two gas supply pipes 232a and 232b are installed as supply passages for supplying a plurality of gases (in the current embodiment, two kinds of gases). In the current embodiment, a first process gas flows along the first gas supply pipe 232a through a first mass flow controller 241a which is a flowrate control device (flowrate control unit) and a first valve 243a which is an on-off valve, and then the first process gas is supplied to the inside of the process chamber 201 through a nozzle 233 (described later) installed in the reaction tube 203. A second process gas flows along the second gas supply pipe 232b through a second mass flow controller 241b which is a flowrate control device (flowrate control unit), a second valve 243b which is an on-off valve, a gas reservoir 247, and a third valve 243c which is an on-off valve, and then the second process gas is supplied to the inside of the process chamber 201 through a gas supply unit 249 (described later).

The first gas supply pipe 232a, the first mass flow controller 241a, the first valve 243a, and the nozzle 233 constitute a first gas supply system for supplying a desired process gas to the process chamber 201. In addition, the second gas supply pipe 232b, the second mass flow controller 241b, the second valve 243b, the gas reservoir 247, the third valve 243c, and the gas supply unit 249 constitute a second gas supply system for supplying a desired process gas to the process chamber 201.

The process chamber 201 is connected to a vacuum pump 246 which is an exhaust device (exhaust unit) via a gas exhaust pipe 231 and a fourth value 243d, so that the process chamber 201 can be evacuated. The fourth valve 243d is an on-off valve which is configured to be opened and closed so as to start and stop evacuation of the process chamber 201, and configured to be adjusted in opening size for pressure controlling.

The gas exhaust pipe 231, the fourth valve 243d, and the vacuum pump 246 constitute a gas discharge system for discharging the inside atmosphere of the process chamber 201.

In an arc-shaped space between an inner wall of the reaction tube 203 forming the process chamber 201 and wafers 200, the nozzle 233 extends at a side opposite to the gas exhaust pipe 231 from a lower part to an upper part of the inner wall of the reaction tube 203 along the piled direction of the wafers 200. A plurality of first gas supply holes 248a are formed in the nozzle 233 as gas supply openings.

Gas injected through the first gas supply holes 248a is supplied to the wafers 200. A gas flow passage defined from the first gas supply holes 248a to the wafers 200 is a process gas supply passage 235.

If the pressure different between the insides of the nozzle 233 and the process chamber 201 is small, it is preferable that the first gas supply holes 248a have the same open area and be formed at the same pitch from the upstream side to the downstream side. However, if the pressure difference is large, it is preferable that the open areas of the first gas supply holes 248a increase or the pitch of the first gas supply holes 248a decrease from the upstream side to the downstream side.

In the current embodiment, the open areas of the first gas supply holes 248a increase gradually from the upstream side to the downstream side. Owing to this configuration, when gas is injected to the process chamber 201 through the first gas supply holes 248a, the flowrate and flow velocity of the gas can be uniformly maintained.

In the arc-shaped space, first and second rod-shaped electrodes 269 and 270 which are first and second electrodes having a slender and long shape are installed in a state where the first and second rod-shaped electrodes 269 and 270 extend from the lower side to the upper side and are protected with electrode protection tubes 275. The process gas supply passage 235, along which an injected first process gas flows, is located between the first and second rod-shaped electrodes 269 and 270.

By supplying predetermined Radio frequency (RF) power to the first and second rod-shaped electrodes 269 and 270, the first process gas can be excited into a plasma state. Preferably, one of the first and second rod-shaped electrodes 269 and 270 is a high potential electrode, and the other is a low potential electrode. In the example shown in the drawing, the first rod-shaped electrode 269 is grounded to a reference potential, and the second rod-shaped electrode 270 is connected to a high-voltage-side RF power source 273 through a matching device 272. Therefore, plasma (P) (refer to FIG. 7) can be generated in a plasma generating region 224 between the first and second rod-shaped electrodes 269 and 270.

The RF power source 273 and the matching device 272 constitute an RF unit 271 capable of outputting predetermined RF power.

The electrode protection tubes 275 are configured so that the first and second rod-shaped electrodes 269 and 270 can be respectively inserted into the process chamber 201 in a state where the first and second rod-shaped electrodes 269 and 270 are isolated from the atmosphere of the process chamber 201. If the atmosphere inside the electrode protection tubes 275 is the same as outside air (atmosphere), the first and second rod-shaped electrodes 269 and 270 inserted respectively in the electrode protection tubes 275 are oxidized by heat of the heater 207. For this reason, an inert gas purge mechanism is installed to fill or purge the inside areas of the electrode protection tubes 275 with inert gas such as nitrogen so as to maintain the oxygen concentration inside the electrode protection tubes 275 at a sufficiently low level for preventing oxidation of the first and second rod-shaped electrodes 269 and 270.

The gas supply unit 249 is installed on the inner wall of the reaction tube 203 at a position making about 90° with the first gas supply holes 248a. When a plurality of gases are supplied to the wafers 200 one after another in a film forming process by an ALD method, the gas supply unit 249 shares the task of supplying the plurality of gases with the nozzle 233.

Like the nozzle 233, the gas supply unit 249 includes a plurality of second gas supply holes (gas supply openings) 248b formed at positions close to the wafers 200 with the same pitch for supplying gas, and the lower part of the gas supply unit 249 is connected to the second gas supply pipe 232b.

If the pressure different between the insides of the gas supply unit 249 and the process chamber 201 is small, it is preferable that the second gas supply holes 248b have the same open area and be formed at the same pitch from the upstream side to the downstream side. However, if the pressure difference is large, it is preferable that the open areas of the second gas supply holes 248b increase or the pitch of the first gas supply holes 248a decrease from the upstream side to the downstream side.

In the current embodiment, the open areas of the second gas supply holes 248b increase gradually from the upstream side to the downstream side.

In addition, the nozzle 233, and the first and second rod-shaped electrodes 269 and 270 protected with electrode protection tubes 275 may be covered with a gas supply unit such as the gas supply unit 249 used to cover the second gas supply pipe 232b. However, this may be not preferable in the case where the gas supply unit functions as an obstacle resulting in deactivation of an active species.

At the center part of the inside of the reaction tube 203, the boat 217, in which a plurality of the wafers 200 are placed in multiple stages at the same intervals, is installed, and the boat 217 can be loaded into and unloaded from the reaction tube 203 by a boat elevating mechanism (not shown). In addition, a boat rotating mechanism 267 which is a rotary device (rotary unit) is installed to rotate the boat 217 and thus to improve processing uniformity, so that the boat 217 held on the boat support stand 218 can be rotated by rotating the boat rotating mechanism 267.

The controller 280, which is a control device, is connected to the first and second mass flow controllers 241a and 241b, the first to fourth valves 243a, 243b, 243c, and 243d, the heater 207, the vacuum pump 246, the boat rotating mechanism 267, a boat elevating mechanism (not shown), the RF power source 273, and the matching device 272, so as to control flowrate adjusting operations of the first and second mass flow controllers 241a and 241b; opening and closing operations of the first to third valves 243a, 243b, and 243c; opening, closing, and pressure adjusting operations of the fourth valve 243d; a temperature adjusting operation of the heater 207; start and stop operations of the vacuum pump 246; a rotation speed adjusting operation of the boat rotating mechanism 267; an elevating operation of the boat elevating mechanism; a power supply operation of the RF power source 273; and an impedance adjusting operation of the matching device 272.

Particularly, while controlling the RF unit 271 to apply predetermined RF power to the first and second rod-shaped electrodes 269 and 270 for generating plasma, the controller 280 controls the first mass flow controller 241a so that a first process gas is supplied from the first gas supply system to the process chamber 201 alternately at a first flowrate and at a second flowrate greater than the first flowrate.

The first process gas supplied at a pulsed flowrate (alternately between the first flowrate and the second flowrate greater than the first flowrate) is one of plural kinds of gases necessary for an ALD method, which is supplied through the first gas supply pipe 232a for plasma excitation.

For the following reasons, the first process gas is supplied at a pulsed flowrate (alternating between the first flowrate and the second flowrate greater than the first flowrate).

When the first process gas is supplied to the stacked wafers 200, as explained above, if the upper and lower wafers 200 are at the same electric potential and the pressure inside the process chamber 201 is uniform, an active species generated by plasma excitation is difficult to enter between the wafers 200 and reach the center parts of the wafers 200. For example, since an active species such as a hydrogen (H) radical has a short lifetime, it is necessary to introduce the hydrogen (H) radical between wafers more quickly.

Figure 5A:
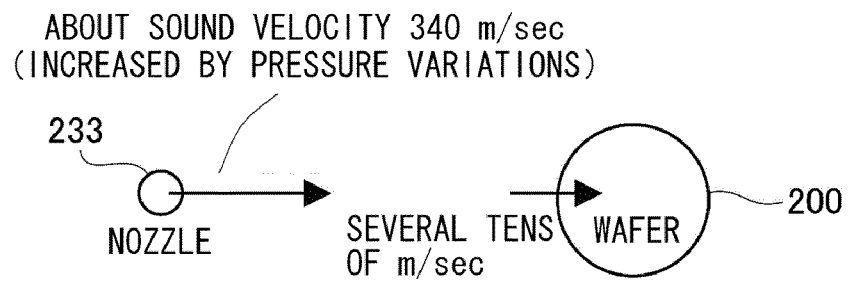
FIG. 5A and FIG. 5B are views for explaining the relationship between a gas flowrate and a gas velocity on a wafer according to an embodiment of the present invention.
Figure 5B:
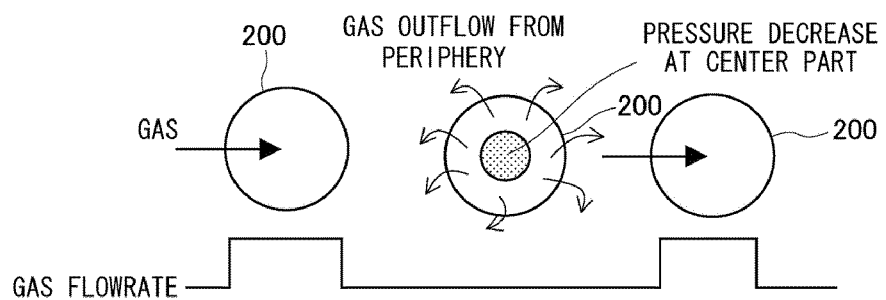

Although a predetermined amount of gas is supplied at a high flowrate, the velocity of the gas on a wafer 200 is only about several meters per second; however, as shown in FIG. 5A and FIG. 5B, if gas is supplied at a pulsed flowrate, the velocity of the gas at the nozzle 233 increases to about the velocity of sound (340 m/sec) owing to pressure variations, and as a result, the velocity of the gas on the wafer 200 approaches to about several tens of meters per second (refer to FIG. 5A).

After the gas arrives at the wafer 200, when the amount of gas injected through the nozzle 233 is reduced, the gas flows outward from the periphery of the wafer 200, and thus the pressure of the center part of the wafer 200 is reduced. Then, when the amount of gas injected through the nozzle 233 is increased (that is, when the next pulse arrives), the gas can arrive at the center part of the wafer 200 (refer to FIG. 5B).

Figure 4:
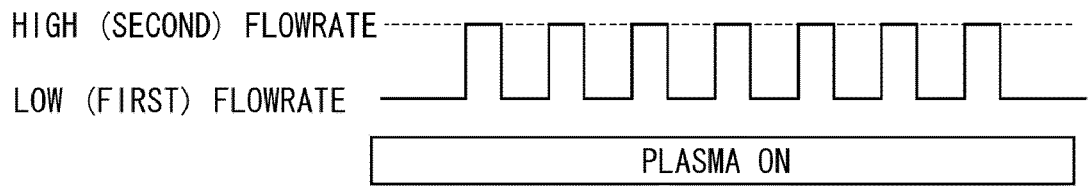
FIG. 4 illustrates a filming forming sequence according to an embodiment of the present invention.

That is, as shown in FIG. 4, during a plasma-on state, by supplying a process gas through the first gas supply system in a pulsed manner alternating between a first flowrate (low flowrate) and a second flowrate (high flowrate) greater than the first flowrate, an active species can be easily brought into contact with the center part of a wafer because the flow velocity of the gas increases owing to pressure variations.

Next, as an example of forming a film with an ALD method, forming a SiN film using DCS ($SiH_2Cl_2$, dichlorosilane) gas and $NH_3$ (ammonia) gas, which is a semiconductor device manufacturing process, will be explained.

In the ALD method which is a kind of CVD method, process gases, which are two (or more) kinds of materials used in film formation, are sequentially supplied to a substrate one after another under predetermined film formation conditions (temperature, time, etc.), and the process gases are adsorbed on the substrate on an atomic layer basis to form a film by a surface reaction.

The use of a chemical reaction is such that, for example, when a silicon nitride (SiN) film is formed by the ALD method, high-quality film growth at a low temperature of 300° C. to 600° C. is possible by using DCS and $NH_3$. In addition, the gas supply is carried out in a way of supplying a plurality of reactive gases one after another. Therefore, the thickness of the film can be controlled by adjusting the number of process gas supply cycles. For example, if the film forming rate is 1 Å/cycle and it is intended to form a 20-Å film, the process is repeated 20 cycles.

For forming SiN films, as shown in FIG. 1 and FIG. 2, wafers 200 are first charged in the boat 217, and the boat 217 is loaded into the process chamber 201. Thereafter, the following four steps are sequentially performed.

(Step 1)

In step 1, $NH_3$ gas necessary for plasma excitation, and DCS gas unnecessary for plasma excitation are allowed to flow in sequence.

First, the first valve 243a installed at the first gas supply pipe 232a, and the fourth valve 243d installed at the gas exhaust pipe 231 are both opened to control the flowrate of $NH_3$ gas by using the first mass flow controller 241a of the first gas supply pipe 232a and inject the $NH_3$ gas into the process chamber 201 through the first gas supply holes 248a of the nozzle 233, and RF power is applied across the first and second rod-shaped electrodes 269 and 270 from the RF power source 273 through the matching device 272 so as to excite the $NH_3$ gas into a plasma state and supply the $NH_3$ gas to the surfaces of wafers 200 as an active species while exhausting the $NH_3$ gas through the gas exhaust pipe 231.

For surely supplying the $NH_3$ gas to the surfaces of the wafers 200 as an active species, it is effective that plasma is previously generated in the process chamber 201 before the $NH_3$ gas is supplied at a high flowrate. For this end, while supplying a large amount of $NH_3$ gas at a pulsed high flowrate, a small amount of $NH_3$ gas is supplied at a low flowrate for previously generating plasma between the first and second rod-shaped electrodes 269 and 270.

Figure 6:
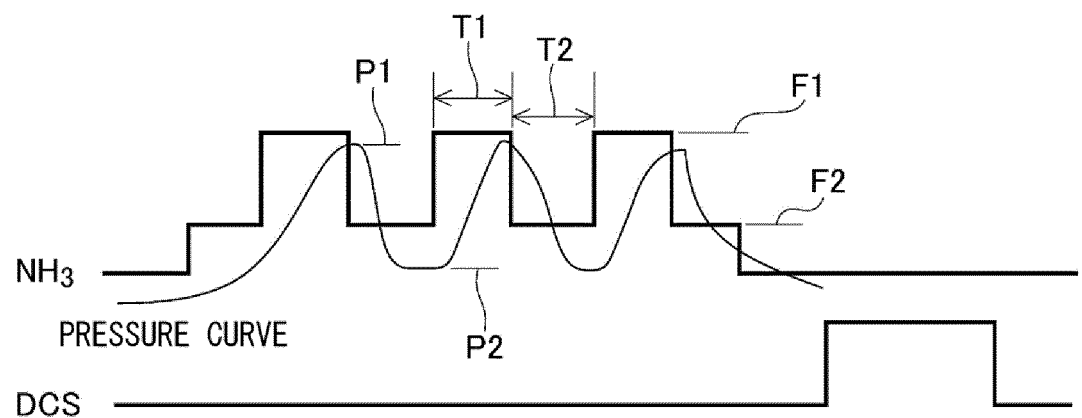
FIG. 6 is a timing chart of two kinds of process gases according to an embodiment of the present invention.

As shown in FIG. 6, when $NH_3$ gas is supplied in a pulsed manner, specifically, the fourth valve 243d is properly adjusted to keep the pressure inside the process chamber 201 at about 50 pa (P1=50 pa) or higher for the case of a high flowrate and at about 5 pa (P2=5 pa) for the case of a low flowrate. In addition, the flowrate of the $NH_3$ gas is controlled by the first mass flow controller 241a at about 1000 sccm (F1=1000 sccm) or higher for the case of a high flowrate and at about 200 sccm (F2=200 sccm) for the case of a low flowrate. Furthermore, in consideration of factors such as plasma ignition timing, gas is injected through the nozzle 233 in a pulsed manner for about 0.5 seconds to about 2 seconds (T1=0.5~2 sec) for the case of a high flowrate and for about 1 second to about 3 seconds (T2=1~3 sec) for the case of a low flowrate.

The wafers 200 are exposed to the active species generated by exciting $NH_3$ gas into a plasma state for a total time of 2 seconds to 120 seconds. At this time, the wafers 200 are kept at a temperature range from 300° C. to 600° C. by the heater 207. Since the reaction temperature of $NH_3$ is high, $NH_3$ does not react with the wafers 200 at the above-mentioned temperature range. Therefore, $NH_3$ is plasma-excited and supplied as an activate species, so that the wafers 200 can react with $NH_3$ (active species) at a preset low temperature range.

While the $NH_3$ gas is plasma-excited and supplied as an activated species, the second valve 243b disposed at the upstream side of the second gas supply pipe 232b is opened, and the third valve 243c disposed at the downstream side of the second gas supply pipe 232b is closed, so as to allow a flow of DCS gas. Then, the DCS gas is stored in the gas reservoir 247 installed between the second and third valves 243b and 243c. At this time, gas flowing in the process chamber 201 is the activated species produced by plasma-exciting $NH_3$ gas, and the DCS gas does not exist in the process chamber 201. Therefore, the $NH_3$ gas does not cause a gas-phase reaction, but is plasma-activated as an active species and reaches the center parts of the wafers 200 so that the activate species can undergo uniform surface reaction (chemical adsorption) with surface parts such as under-layer films of the wafers 200.

(Step 2)

In step 2, the first valve 243a of the first gas supply pipe 232a is closed to cut off the supply of the $NH_3$ gas, but the DCS gas is allowed to flow continuously to the gas reservoir 247. When a predetermined amount of the DCS gas is filled in the gas reservoir 247 at a predetermined pressure, the upstream-side second valve 243b is closed so as to confine the DCS gas in the gas reservoir 247. In addition, the fourth valve 243d of the gas exhaust pipe 231 is kept in an opened state so as to exhaust the inside of the process chamber 201 to a pressure of 20 Pa or lower by using the vacuum pump 246, and thereby to remove the $NH_3$ gas remaining in the process chamber 201. At this time, inert gas such as $N_2$ can be supplied to the process chamber 201 to increase the efficiency of removing the remaining $NH_3$ gas from the process chamber 201.

Inside the gas reservoir 247, the DCS gas is stored at a pressure of 20000 Pa or higher. In addition, it is configured so that the conductance between the gas reservoir 247 and the process chamber 201 is equal to or higher than $1.5 \times 10^{-3}$ m$^3$/s. When the volume of the reaction tube 203 and the corresponding volume of the gas reservoir 247 are considered, it is preferable that if the volume of the reaction tube 203 is 100 l, the volume of the gas reservoir 247 be 100 cc to 300 cc, and in terms of volume ratio, it is preferable that the volume of the gas reservoir 247 be 1/1000 to 3/1000 the volume of the reaction tube 203.

(Step 3)

In step 3, after the reaction tube 203 is completely exhausted, the fourth valve 243d of the gas exhaust pipe 231 is closed to stop the exhausting operation. Then, the third valve 243c disposed at the downstream side of the second gas supply pipe 232b is opened. Thus, the DCS contained in the gas reservoir 247 is supplied to the process chamber 201 all at once. At this time, since the fourth valve 243d of the gas exhaust pipe 231 is closed, the pressure inside the process chamber 201 increases steeply up to about 931 Pa (7 Torr). The time for supplying the DCS gas is set to 2 seconds to 4 seconds; exposure time to the increased-pressure atmosphere is set to 2 seconds to 4 seconds; and the total time is set to 6 seconds. At this time, the temperature of the wafers 200 is maintained at a desired temperature in the range from 300° C. to 600° C. like in the case of supplying the NH$_3$ gas. By the supply of the DCS gas, NH$_3$ adsorbed on the surfaces of the wafers 200 undergoes a reaction (chemical adsorption) with DCS, and thus SiN films are formed on the wafers 200.

(Step 4)

In step 4 after the film formation, the third valve 243c is closed and the fourth valve 243d is opened so as to evacuate the process chamber 201 for removing the DCS gas remaining in the process chamber 201. In addition, at this time, inert gas such as N$_2$ can be supplied to the process chamber 201 for increasing the efficiency of removing the DCS gas which remains in the process chamber 201 after the film formation. In addition, the second valve 243b is opened to start supply of DCS gas to the gas reservoir 247.

The above-described steps 1 to 4 are set as one cycle, and the cycle is repeated a plurality of times to form a SiN film to a predetermined thickness.

In an ALD apparatus, gas is chemically adsorbed on the surface of a wafer 200. The amount of adsorbed gas is proportional to the pressure of the gas, and the exposure time to the gas. Therefore, to allow a desired amount of gas to be adsorbed in a short time, it is necessary to increase the pressure of the gas rapidly. In this point, according to the current embodiment, DCS gas stored in the gas reservoir 247 is rapidly supplied after closing the fourth valve 234d so that the pressure of the DCS gas inside the process chamber 201 can be steeply increased, and a desired amount of gas can be instantaneously adsorbed.

In the current embodiment, the supply of plasma-excited NH$_3$ gas as an activated species, which is a necessary step for an ALD method, and the exhaustion of the process chamber 201 are performed during DCS gas being stored in the gas storage 347, so that a special step is not necessary for storing the DCS gas. In addition, after NH$_3$ gas is removed from the process chamber 201 by exhausting the process chamber 201, DCS gas is allowed to flow into the process chamber 201 so that both gases do not react with each other on the way to the wafer 200. Therefore, the supplied DCS gas can be effectively reacted only with NH$_3$ adsorbed on the wafer 200.

In the embodiment shown in FIG. 1, the first rod-shaped electrode 269 is grounded to a reference potential (low potential side), and the second rod-shaped electrode 270 is connected to the RF power source 273 (high potential side) through the matching device 272.

Figure 7:
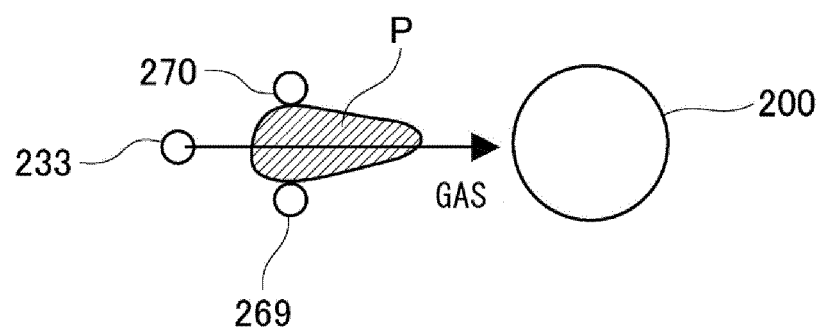
FIG. 7 is a view for explaining a shape of plasma when a ground electrode and a radio frequency (RF) electrode are used according to an embodiment of the present invention.

Therefore, as shown in FIG. 7, plasma (P) generated between the first rod-shaped electrode (ground electrode) 269 and the second rod-shaped electrode (RF electrode) 270 is drawn by a gas flow so that the region of the plasma (P) is extended. As a result, a radical start region extends close to the wafer side, and thus a radical species can be supplied to center regions between wafers more surely.

Effects of Embodiments

According to the current embodiment, in the substrate processing apparatus for forming films on a plurality of wafers by supplying radical species between the wafers, a radical species of each process gas is introduced between the wafers by supplying the process gas instantly between the wafers. Therefore, the radical species can be sent to the center parts of the wafers. In this case, if the process gas is supplied in a pulsed manner at a high flowrate while maintaining a low-flowrate supply of the process gas, the radical species can be sent to the center parts of the wafers more surely and rapidly owing to a velocity caused by pressure variations. Therefore, rarefaction of a radical species at the center parts of wafers arranged in multiple states can be prevented. As a result, films can be uniformly formed on the wafers to reduce a wafer process time, and thus a substrate processing apparatus having good productivity can be provided. Particularly, in the case of NH$_3$ is used as a process gas, a NH$_3$ radical is required to be rapidly introduced between wafers due to its short lifetime, and this requirement can be sufficiently satisfied according to the current embodiment.

The present invention is not limited to the above-described embodiments, and various changes in form and details may be made in the embodiments without departing from the spirit and scope of the present invention.

For example, in the embodiment shown in FIG. 1, it is explained that the first rod-shaped electrode and the second rod-shaped electrode are installed at low and high potential sides, respectively; however, two or more second rod-shaped electrodes may be installed at a high potential side for a first rod-shaped electrode installed at a low potential side.

In the case where a second rod-shaped electrode is installed alone at the high potential side, plasma can be dissipated by pressure variations when a process gas is supplied at a pulsed high flowrate. That is, during a pulsed high-flowrate supply of a process gas, it is necessary to maintain a low-flowrate supply of the process gas for previously generating plasma. However, in this case, if plasma generating conditions are adjusted based on a low pressure condition of the low-flowrate supply, generated plasma can be dissipated by a high pressure condition of the high-flowrate supply.

Figure 8:
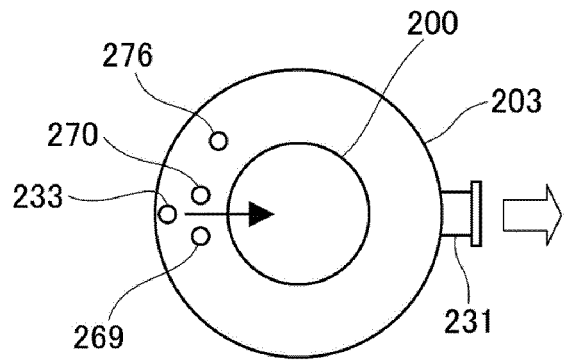
FIG. 8 is a view illustrating a process chamber in which a third electrode is disposed according to an embodiment of the present invention.

Therefore, as a countermeasure for solving this problem, a plurality of second electrodes can be installed at different distances from a first electrode so as to maintain a plasma generation state against a high pressure condition of a high-flowrate supply of a process gas. For example, according to a modified embodiment of FIG. 8, two rod-shaped electrodes 270 and 276 are installed at an RF side. The RF-side rod-shaped electrodes 270 and 276 are installed at different distances from a grounded rod-shaped electrode 269. Therefore, between the first and second rod-shaped electrode 269 and 270, and the first and second rod-shaped electrodes 269 and 276, plasma can be generated under different pressure conditions.

As explained above, the second rod-shaped electrodes 270 and 276 are disposed at difference distances from the first rod-shaped electrode 269 as an effective method of preventing dissipation of plasma. However, since this method requires a plurality of second electrodes, there is room for improvement. That is, if the same electrode gap variation effect can be accomplished by using only two electrodes (first and second rod-shaped electrodes 269 and 270) to generate plasma under different pressure conditions as described above, simplification of a structure is possible.

Figure 9A:
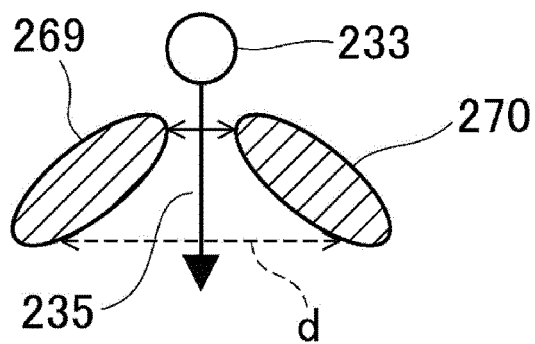
FIG. 9A and FIG. 9B are views illustrating examples of distance variations between two electrodes according to embodiments of the present invention.
Figure 9B:
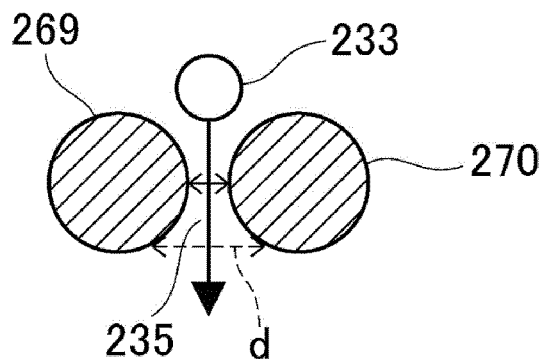

FIG. 9A and FIG. 9B illustrate gap variation examples accomplished by using two electrodes. FIG. 9A illustrates first and second rod-shaped electrodes 269 and 270 having an elliptical or oval cross section, which are bilaterally and symmetrically arranged to form a process gas supply passage 235 having a downwardly widening shape. FIG. 9B illustrates first and second rod-shaped electrodes 269 and 270 having a circular cross section, which are bilaterally and symmetrically arranged to form a process gas supply passage 235 therebetween. Owing to the continuity in the electrode distance, the electrode structures of FIG. 9A and FIG. 9B may be more advantageous for improving plasma ignition characteristics than that of the embodiment shown in FIG. 8 where a plurality of second electrodes are arranged.

In the case where a plurality of second electrodes at disposed at different positions or the distance between first and second electrodes is varied, the relationship between an electrode distance (gap) and a plasma discharge start voltage becomes important. This will now be described.

Figure 11:
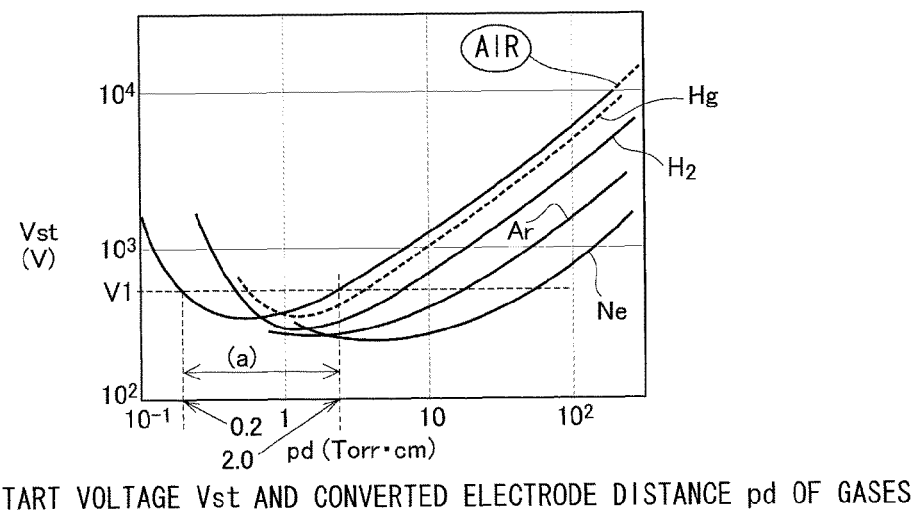
FIG. 11 is a characteristic diagram of Paschen's law, showing the relationship between discharge start voltage $V_{st}$ and converted electrode distance pd for a plurality of gases according to an embodiment of the present invention.

FIG. 11 is a characteristic diagram of Paschen's Law, showing the relationship between discharge start voltage $V_{st}$ and pressure (p)×electrode distance (d) (converted electrode distance pd) for a plurality of gases such as air. The horizontal axis denotes pd, and the vertical axis denotes $V_{st}$. In the case of capacitively coupled plasma (CCP), the discharge start voltage $V_{st}$ has a minimal value with respect to the converted electrode distance pd determined as a product of the distance (d) between parallel plates and pressure (d). Although $NH_3$ gas is not shown in FIG. 11, it is considered that the discharge voltage characteristics of the $NH_3$ gas are similar to those of air.

In FIG. 11, when a predetermined electrode distance is given, a pressure range where an electric discharge can be initiated can be calculated as follows. For example, if the maximal value of an AC voltage across electrodes is V1 before initiation of a discharge in air, discharge start conditions can be satisfied within a horizontal-axis distance (a) between crossing points of the discharge start voltage curve of air and the maximal value V1. At this time, the pd ranges from 0.2 Torr-cm to 2 Torr-cm. Thus, if the distance (d) between the electrodes is 2 cm (d=2 cm), the pressure range where an electric discharge can be initiated can be calculated as a range of 0.1 Torr to 1.0 Torr by dividing the pd range by d=2 cm. Therefore, if the pressure of gas supplied in a pulsed manner is within this pressure range, a discharge can be initiated.

Figure 10:
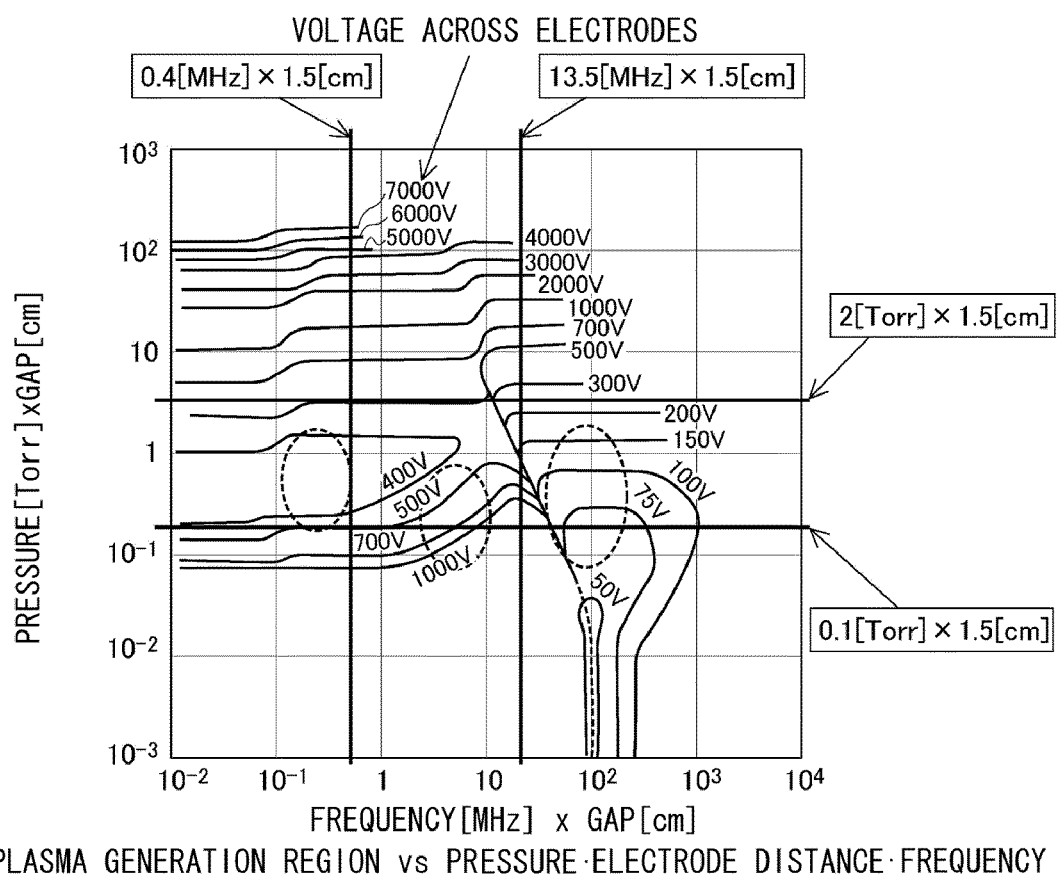
FIG. 10 is a characteristic diagram illustrating a plasma generation region in relation with pressure, electrode distance, and frequency according to an embodiment of the present invention.

In practical discharge initiation conditions, the frequency of an RF power source is included, as well as pressure, electrode distance, and voltage. Plasma generation conditions are determined by the product of the pressure of a plasma medium and the distance between electrodes if frequency is constant. FIG. 10 shows the relationship among pressure, electrode gap, and frequency for the case of air atmosphere instead of a $NH_3$ atmosphere (Mitsuharu Konuma, "Fundamentals of Plasma and Film Formation," Nikkan Kogyo Shinbun-sha). The horizontal axis denotes frequency [MHz]×gap [cm], and the vertical axis denotes pressure [Torr]×gap [cm], and parameters of characteristic curves are discharge start voltages [V] across electrodes. In the case where a discharge start voltage is given as a parameter, each characteristic curve corresponds to a plasma generation region. In an oblique section of each characteristic curve (not a parallel section with the horizontal axis), the plasma generation conditions have a large permissible pressure range.

In FIG. 10, when a predetermined electrode distance is given in an air atmosphere, a plasma generation region can be estimated as follows. Although a discharge can occur easily if there is a large voltage difference, an extremely high voltage is not preferable when apparatus usability is considered. Therefore, if the discharge start voltage is slightly varied centered on its minimal value which is described in FIG. 11 (refer to (a) of FIG. 11) in a condition where the electrode distance (gap) is set to a constant value of d=1.5 cm, a discharge window can be extended by putting the pressure in the range from 0.1 Torr to 2.0 Torr. Then, by putting the frequency of the RF power source in the range from 0.4 MHz to 13.4 MHz, a plasma generation region enclosed by four lines is determined. If the electrode gap can be varied, the pressure range (discharge start pressure range) can be widened.

Figure 12A:
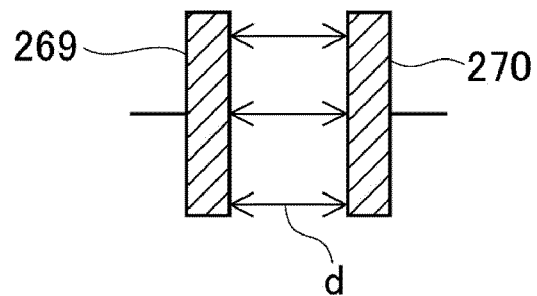
FIG. 12A to FIG. 12D are views illustrating an electrode structure in which two electrodes are uniformly spaced, and other electrode structures in which the distance between two electrodes are varied, according to embodiments of the present invention.
Figure 12B:
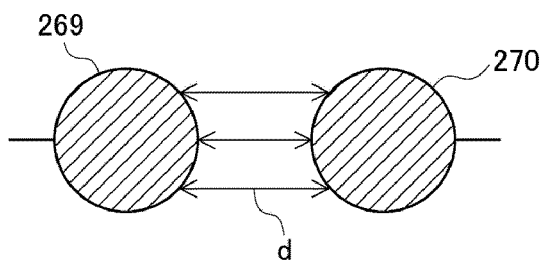
Figure 12C:
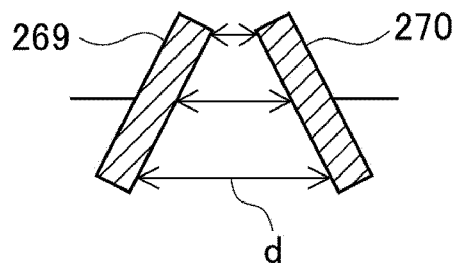
Figure 12D:
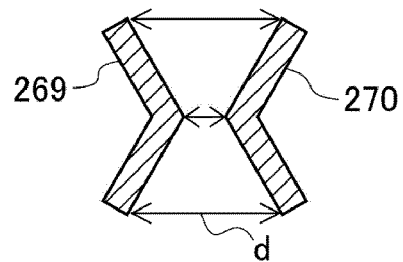
Figure 13A:
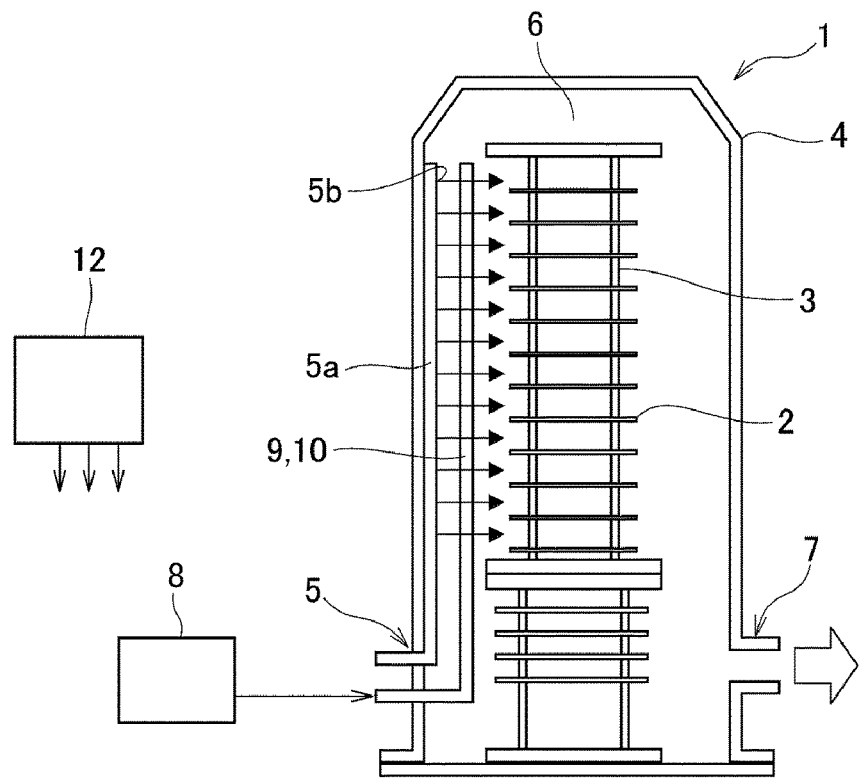
FIG. 13A and FIG. 13B are views illustrating a process structure of a substrate processing apparatus of the related art.
Figure 13B:
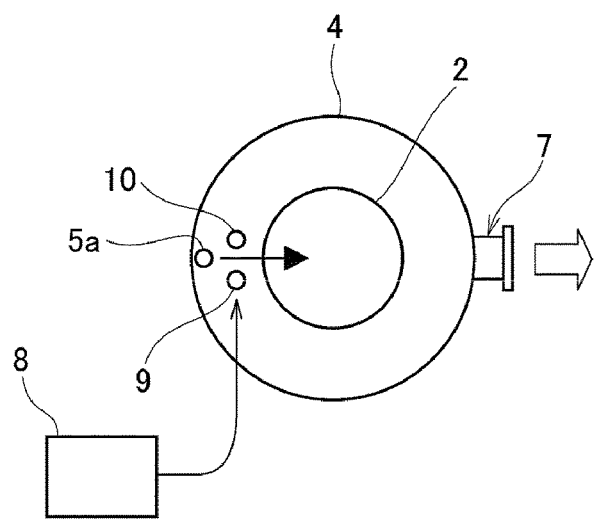

Therefore, as shown in FIG. 12B to FIG. 12D except for FIG. 12A where the gap between parallel plate electrodes 269 and 270 is the same along a process gas passage, by using electrodes 269 and 270 having a circular cross section, disposing plate electrodes 269 and 270 in a triangular shape, or disposing "<" shaped electrodes 269 and 270 with their backsides facing each other, the gap between the electrodes can be varied along a process gas passage, so as to widen a discharge start pressure range.

In the embodiment, an explanation is given on the case where a plasma source is a CCP source; however, the present invention is not limited thereto. The present invention can be applied to any kind of plasma source, for example, an inductively coupled plasma (ICP) source. According to process conditions such as a pressure, a discharge may occur easily or not in the cases of CCP and ICP sources. For example, in a low pressure condition, the ICP source may be preferable since high-density plasma can be generated.

In addition, since an ALD method is used as a film forming method in the current embodiment, $NH_3$ to be excited is supplied in a short time in a pressure condition varying from a low pressure of 5 pa to a high pressure of 50 pa having one more digit than the low pressure. However, application of this condition to DCS is not preferable because only Si is deposited on a wafer like in a plasma CVD method.

According to the present invention, an active species can be sufficiently supplied between substrates, and thus the substrate can be uniformly processed.

(Supplementary Note)

The present invention also includes the following embodiments.

(Supplementary Note 1)

According to a preferred embodiment of the present invention, there is provided a substrate processing apparatus including: a process chamber configured to accommodate a plurality of stacked substrates; a gas supply system configured to supply a desired process gas to the process chamber; a gas discharge system configured to exhaust an inside atmosphere of the process chamber; an RF (radio frequency) unit configured to output predetermined RF power; an electrode configured to receive the predetermined RF power from the RF unit for exciting the process gas into a plasma state; and a control device configured to control the gas supply system, the gas discharge system, and the RF unit, wherein while the control device controls the RF unit to apply predetermined RF power to the electrode for generating plasma, the control device controls the gas supply system to supply the process gas to the process chamber alternately at a first flowrate and at a second flowrate greater than the first flowrate. Therefore, a radical species of the process gas generated by the plasma can be surely supplied to the center parts of the substrates (wafers). Particularly, it is preferable that the substrate processing apparatus be a vertical ALD apparatus that uses a sequence of supplying a raw material at a pulsed flowrate while generating plasma by a constant-flowrate of a raw material.

(Supplementary Note 2)

In the substrate processing apparatus of Supplementary Note 1, the electrode may include a first electrode at a low potential side and a second electrode at a high potential side, and the plasma may be generated between the first and second electrodes. Since a plasma region can be extended owing to dragging by a gas flow, a radical species can be supplied to the center part of a wafer more surely.

(Supplementary Note 3)

In the substrate processing apparatus of Supplementary Note 2, the second electrode may include a plurality of electrodes installed at different distances from the first electrode. Since the process gas is supplied alternately at the first and second flowrates, extinction of plasma can be prevented. Particularly, it is preferable that the substrate processing apparatus be a vertical ALD apparatus, in which at least three electrodes are disposed at difference positions in parallel with a wafer in a process chamber, and a raw-material supply nozzle is disposed to supply a film forming material between the electrodes toward the wafer.

(Supplementary Note 4)

In the substrate processing apparatus of Supplementary Note 2, a distance between surfaces of the first and second electrodes may be varied along a predetermined direction. Since plasma is generated at a plurality of pressure bands, extinction of plasma can be prevented. Particularly, it is preferable that the substrate processing apparatus be a vertical ALD apparatus, in which a raw-material supply nozzle is disposed to supply a film forming material between two electrodes toward a wafer side in a process chamber, and the distance between mutually facing surfaces of the two electrodes is varied.

(Supplementary Note 5)

According to another preferred embodiment of the present invention, there is provided a semiconductor device manufacturing method for forming a film by using a substrate processing apparatus including: a process chamber configured to accommodate a plurality of stacked substrates; a gas supply system configured to supply a desired process gas to the process chamber; a gas discharge system configured to exhaust an inside atmosphere of the process chamber; an RF (radio frequency) unit configured to output predetermined RF power; an electrode configured to receive the predetermined RF power from the RF unit for exciting the process gas into a plasma state; and a control device configured to control the gas supply system, the gas discharge system, and the RF unit, the semiconductor device manufacturing method including: controlling the gas supply system by using the control device to supply a process gas to the process chamber alternately at a first flowrate and at a second flowrate greater than the first flowrate while controlling the RF unit by using the control device so as to apply predetermined RF power to the electrode for generating plasma. Therefore, a radical species can be surely supplied to the center parts of the substrates (wafers).

(Supplementary Note 6)

The gas supply system may include a nozzle, which extend along the stacked direction of the substrates and includes a plurality of gas supply holes for supplying the process gas to the substrates. It is preferable that the first and second electrodes be installed on both sides of a process gas supply passage extending from the gas supply holes to the substrates. Therefore, a radical species can be surely supplied to the center parts of the substrates.

What is claimed is:

1. A semiconductor device manufacturing method for forming a film by using a substrate processing apparatus including: a process chamber configured to accommodate a plurality of stacked substrates; a gas supply system configured to supply a desired process gas to the process chamber; a gas discharge system configured to exhaust an inside atmosphere of the process chamber; an RF (radio frequency) unit configured to output predetermined RF power; an electrode configured to receive the predetermined RF power from the RF unit for exciting the process gas into a plasma state; and a control device configured to control the gas supply system, the gas discharge system, and the RF unit, the semiconductor device manufacturing method comprising:

while controlling the RF unit by using the control device so as to apply predetermined RF power to the electrode for generating plasma, controlling the gas supply system by using the control device to supply a process gas to the process chamber alternately at a first flowrate and at a second flowrate greater than the first flowrate.

2. A substrate processing apparatus comprising:

a process chamber configured to accommodate a plurality of stacked substrates;

a gas supply system configured to supply a desired process gas to the process chamber;

a gas discharge system configured to exhaust an inside atmosphere of the process chamber;

an RF (radio frequency) unit configured to output predetermined RF power;

an electrode configured to receive the predetermined RF power from the RF unit for exciting the process gas into a plasma state; and a control device configured to control the gas supply system, the gas discharge system, and the RF unit, wherein while the control device controls the RF unit to apply predetermined RF power to the electrode for generating plasma, the control device controls the gas supply system to supply the process gas to the process chamber alternately at a first flowrate and at a second flowrate greater than the first flowrate.

3. The substrate processing apparatus of claim 2, wherein the electrode comprises a first electrode at a low potential side and a second electrode at a high potential side, and the plasma is generated between the first and second electrodes.

4. The substrate processing apparatus of claim 3, wherein the second electrode comprises a plurality of electrodes installed at different distances from the first electrode.

5. The substrate processing apparatus of claim 2, wherein a distance between surfaces of the first and second electrodes is varied along a predetermined direction.

* * * * *